United States Patent
Mao et al.

(10) Patent No.: US 7,991,439 B2
(45) Date of Patent: Aug. 2, 2011

(54) SIGNAL SHIELDING BOX WITH A PLURALITY OF SHIELDING COVERS

(75) Inventors: Li-Kai Mao, Taoyuan County (TW); Po-Chang Lin, Chiayi (TW)

(73) Assignee: Foxconn Communication Technology Corp., Taoyuan County (TW)

( * ) Notice: Subject to any disclaimer, the term of this patent is extended or adjusted under 35 U.S.C. 154(b) by 605 days.

(21) Appl. No.: 12/059,184

(22) Filed: Mar. 31, 2008

(65) Prior Publication Data

US 2009/0149141 A1 Jun. 11, 2009

(30) Foreign Application Priority Data

Dec. 7, 2007 (TW) .............................. 96146767 A

(51) Int. Cl.
*H04B 1/38* (2006.01)

(52) U.S. Cl. ............... 455/575.1; 455/115.1; 455/575.8; 455/128

(58) Field of Classification Search ............... 455/575.1, 455/575.8, 90.3, 556.1, 115.1, 115.3, 117, 455/128, 106, 95, 575.6, 575.5; 343/702

See application file for complete search history.

(56) References Cited

U.S. PATENT DOCUMENTS

| 7,512,430 B2 * | 3/2009 | Nakamura | 455/575.8 |
| 7,640,045 B2 * | 12/2009 | Troutman | 455/575.8 |
| 2004/0137972 A1 * | 7/2004 | Kishimoto | 455/575.8 |

FOREIGN PATENT DOCUMENTS

| JP | 11-30679 | 2/1999 |
| TW | M248234 | 10/2004 |

* cited by examiner

*Primary Examiner* — John J Lee
(74) *Attorney, Agent, or Firm* — Steven M. Reiss

(57) ABSTRACT

A signal shielding box with a plurality of shielding covers is provided. The shielding covers are pivotally connected with a shielding case and cover one another so as to respectively conceal or expose the opening. A connector is positioned at the shielding case and is electrically connected with the wireless communication device within the shielding case. The connector is electrically connected with a measurement and analysis device out of the shielding case. The shielding covers are respectively opened and closed so as to expose and conceal the opening. Thus, a plurality of shielding effects are formed so as to shield and measure signals of the wireless communication device.

19 Claims, 6 Drawing Sheets

SIGNAL SHIELDING BOX WITH A PLURALITY OF SHIELDING COVERS

BACKGROUND OF THE INVENTION

1. Field of the Invention

The present invention relates to a signal shielding box, and in particular to a signal shielding box which is used to measure a wireless communication device and has a plurality of shielding covers.

2. Description of Related Art

Electronic devices during research period or before shipping should be subjected to measurement within electromagnetic interference (EMI) environment so as to be compatible with specific requirement. The electronic devices are usually subjected to measurement within a separated environment such as electromagnetic shielding room worth of tens of millions NT dollars or signal shielding box.

FIG. 1 illustrates a schematic of signal shielding box in prior art and is a representative drawing of Taiwan Patent No. M294830. A shielding cover 2 (pivotal cover) is rotatably connected with a shielding box 1 (shielding housing), and the shielding cover 2 is supported by resilient rod 21. The electronic device 5 is placed within a receiving space 11 of the shielding box 1 so that the electronic device 5 is subjected to measurement.

However, only one pivotal cover (shielding cover 2) is utilized in prior art, and the electronic device 5 is subjected to measurement under fully opened and fully closed environments. It fails to simulate practical environment when the electronic devices are in used. When wireless communication devices move within mobile environment, strength change of signals is complicated. For example, strength of signal is changing, and execution procedure of software is problematic when base station is re-connected with the wireless communication device. Thus, we need to confirm whether gain of receiver/transmitter antenna is proper and execution procedure of software is normal. It needs simulation of measurement under various environments (a plurality of shielding effects).

In addition, the signal shielding box in prior art needs much more space above the signal shielding box when the shielding cover 2 is opened by the resilient rod 21. The shielding cover 2 is rotatably connected with the shielding box 1 and heavy-weighted to effectively shield electromagnetic wave so it is not convenient to open the shielding cover 2 by an electrical motor but manually. The resilient rod 21 is needed to support opening or closing the shielding cover 2.

When the electronic devices are subjected to measurement, the shielding cover 2 may be opened and closed hundred times or even tens of thousands times manually. It is tiresome for test personals to open and close tens of thousands times manually. In addition, the signal shielding box is unlikely compatible with automatic design if it is not convenient to open or close the shielding cover 2 by the electrical motor. In this light, the electronic devices cannot be measured under a variety of environments (shielding effects) by automatically controlling the shielding cover 2.

As to measurement of wireless communication devices described above, the signal shielding box in prior art is not properly utilized.

Thus, there is a need for a signal shielding box which is used to measure a wireless communication device and has a plurality of shielding covers to overcome above disadvantages.

SUMMARY OF THE INVENTION

It is an object of the present invention to provide a signal shielding box with a plurality of shielding covers to form a variety of shielding effects for measurement of wireless communication devices. In addition, the signal shielding box of the present invention does not need additional space above it when a plurality of shielding covers are opened and closed so the present invention saves space. Because the shielding covers are pivotally connected with a pivot, it is easy to open or close the covers and compatible with automatic design. Thus, it is easy to open and close the plurality of shielding covers, and measurement result is much more accurate.

The present invention provides a signal shielding box with a plurality of shielding covers so as to shield and measure signals of a wireless communication device. The signal shielding box includes a shielding case, a connector, and the plurality of shielding covers.

The shielding case is used to receive the wireless communication device and has an opening, and the connector is positioned at the shielding case and electrically connected with the wireless communication device within the shielding case. The wireless communication device is electrically connected with a measurement and analysis instrument which is out of the shielding case through the connector.

The plurality of shielding covers are pivotally and concentrically connected with the shielding case. Because each of the shielding covers has a similar convex appearance, the shielding covers are adjacent and move in a similar way.

According to the present invention, each of the shielding covers is respectively opened or closed so that a variety of shielding effects is formed to shield the wireless communication device. Thus, we can make sure whether signal strength of the wireless communication device is good and procedure of software execution is correct.

Radius of the shielding case is approximately equal to that of each shielding cover so that angle of a sector formed between fringes of the shielding covers and the opening of the shielding case range from 30 degrees to 180 degrees. Preferably, the angle of the sector is larger than 90 degrees. That is, as viewed from side view of the signal shielding box, the angle of the sector ranges from 30 degrees to 180 degrees if the pivot is where the shielding covers are pivotally connected with the shielding case. In addition, the signal shielding box also includes an electrical motor which connects with the pivot of the shielding case to drive the shielding covers to be opened or closed. The present invention also includes a control unit to automatically drive the electrical motor and control the signal shielding box.

Therefore, the present invention relates to a signal shielding box with a plurality of shielding covers so a variety of shielding effects are formed to measure the wireless communication devices. In this light, environment around the wireless communication devices is similar to usage environment. Moreover, the present invention does not need additional space above the signal shielding box when the shielding covers are opened and closed so the present invention saves space. Because the shielding covers are pivotally connected with the pivot of the shielding case, it is easy to open or close the covers and compatible with automatic design. In addition, it is easy to open and close the plurality of shielding covers, and measurement result is much more accurate.

BRIEF DESCRIPTION OF THE DRAWINGS

The present invention can be fully understood from the following detailed description and preferred embodiment with reference to the accompanying drawings, in which.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

Figure 1:
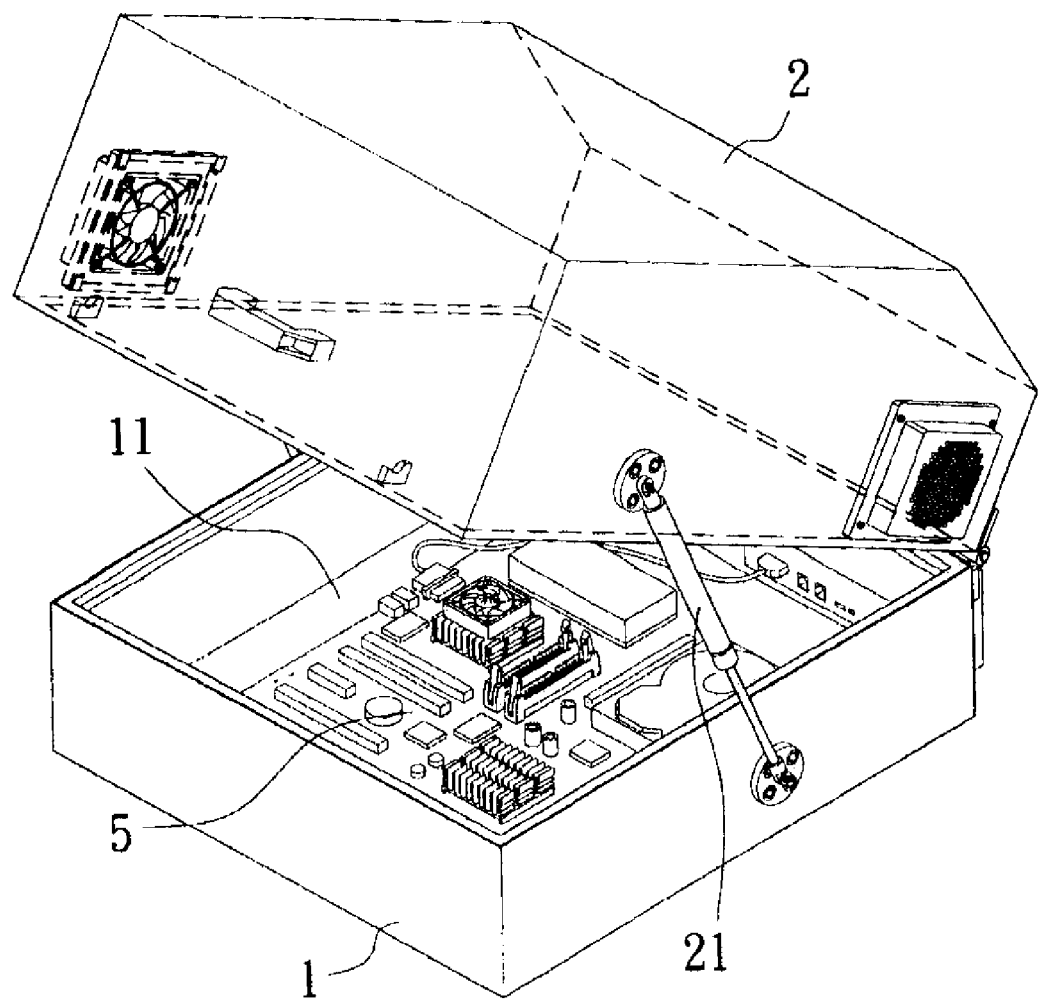
FIG. 1 is a perspective view of a signal shielding box in prior art.
Figure 2:
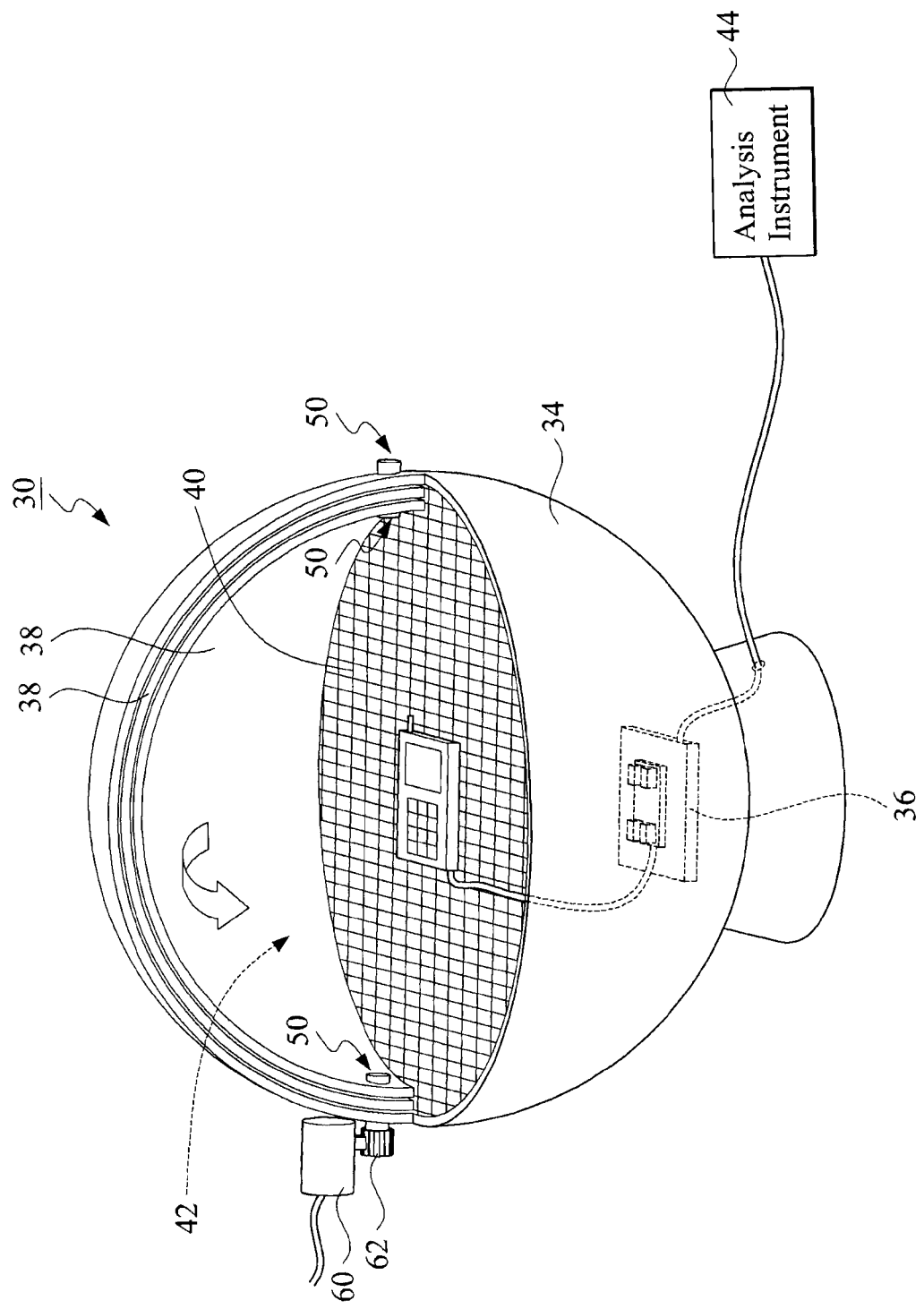
FIG. 2 is a perspective view of a signal shielding box according to the present invention.

Referring to FIG. 2, FIG. 2 illustrates a perspective view of a signal shielding box 30 according to the present invention. The signal shielding box 30 is used to shield and measure signals of a wireless communication device 32, and includes a shielding case 34, a connector 36, and a plurality of shielding covers 38. As FIG. 2 showing, the signal shielding box 30 could be formed in spherical shape.

The shielding case 34 is used to receive the wireless communication device 32 and has an opening 42. A metallic mesh 40 is positioned within the shielding case 34 to support the wireless communication device 32.

The connector 36 is positioned at the bottom of the shielding case 34 as shown in FIG. 2, and is electrically connected with the wireless communication device 32 within the shielding case 34 and with a measurement and analysis instrument 44 out of the shielding case 34. The wireless communication device 32 is powered by the connector 36. In addition, with the connector 36, the measurement result is transmitted to the measurement and analysis instrument 44, and the measurement and analysis instrument 44 sends instruction or command to the wireless communication device 32.

The shielding covers 38 are pivotally and concentrically connected with the shielding case 34 so that the opening 42 will be concealed or exposed by the shielding covers 38. Each of the shielding covers 38 has a similar convex surface in appearance, and the appearances of the shielding cover 38 are not limited to convex surfaces. If the shielding covers 38 have a convex surface in appearance, then the shielding covers 38 are adjacent and move in a similar way.

To much more easily open and close the shielding covers 38, the shielding covers 38 are pivotally connected with a pivot 50 of the shielding case 34. Radius of the shielding case 34 is approximately equal to that of each of the shielding covers 38 so that the angle of the sector formed between fringes of the shielding covers 38 and the opening 42 of the shielding case 34 ranges from 30 degrees to 180 degrees. Preferably, the angle of the sector is larger than 90 degrees. That is, as viewed from side view of the signal shielding box 30, the angle of the sector ranges from 30 degrees to 180 degrees if the center is the pivot 50.

Figure 3:
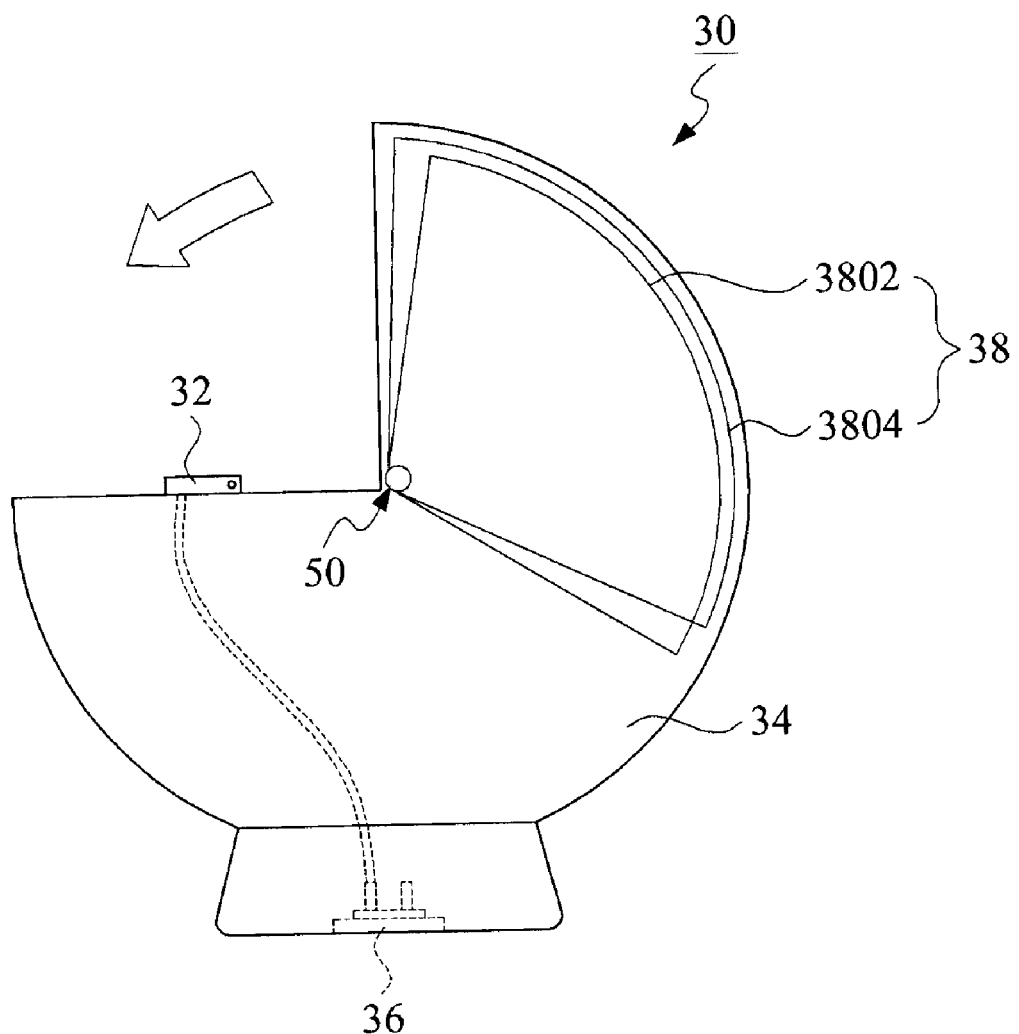
FIG. 3 is a cross-sectional view of a first embodiment of signal shielding box according to the present invention.
Figure 4:
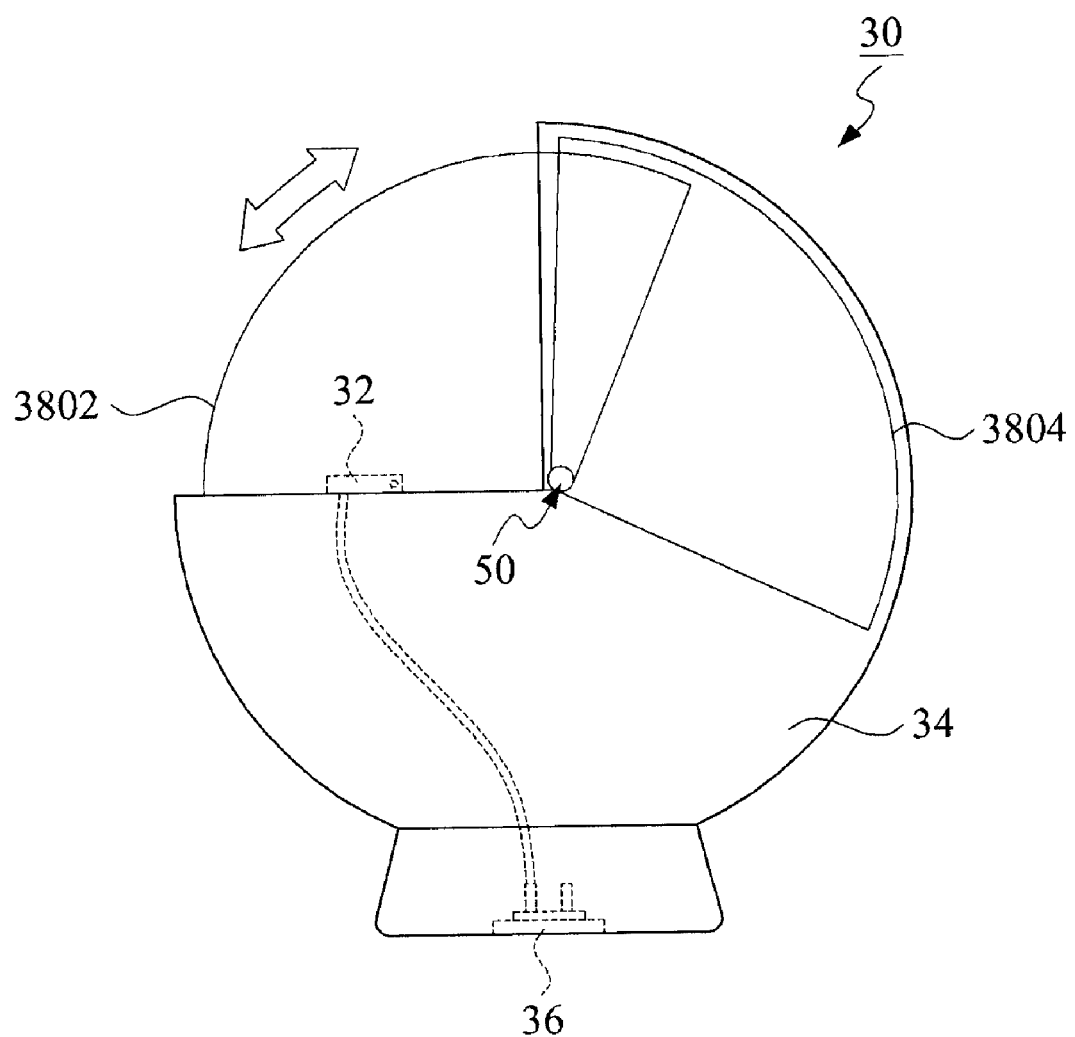
FIG. 4 is a cross-sectional view of a second embodiment of signal shielding box according to the present invention.
Figure 5:
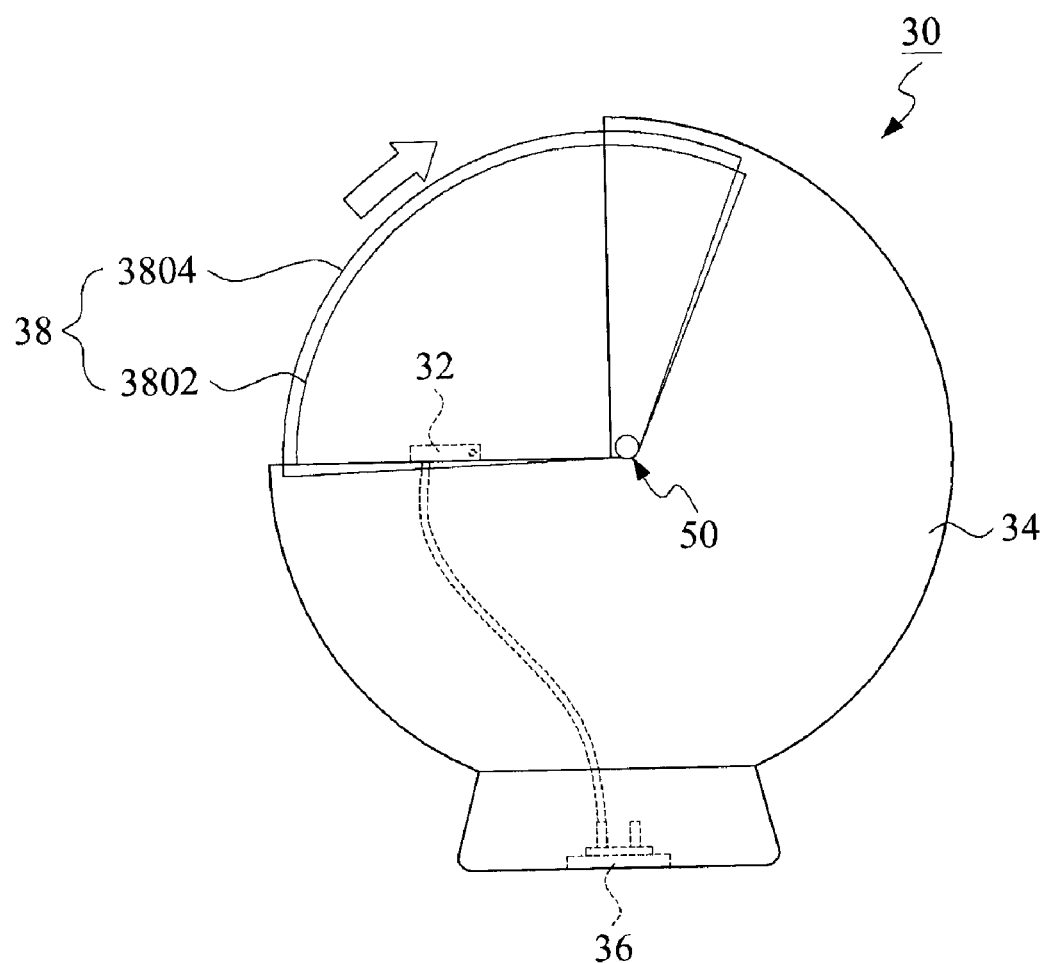
FIG. 5 is a cross-sectional view of a third embodiment of signal shielding box according to the present invention.

Furthermore, please refer to FIGS. 3, 4 and 5. FIG. 3 illustrates a cross-sectional view of a first embodiment of the signal shielding box 30 according to the present invention. FIG. 4 illustrates a cross-sectional view of a second embodiment of the signal shielding box 30 according to the present invention. FIG. 5 illustrates a cross-sectional view of a third embodiment of the signal shielding box 30 according to the present invention. According to the embodiments of the present invention, the signal shielding box 30 has two shielding covers 38 including a first shielding cover 3802 and a second shielding cover 3804. The first shielding cover 3802 is pivotally connected with the shielding case 34 to conceal or expose the opening 42. The second shielding cover 3804 is pivotally connected with the shielding case 34 to conceal or expose the opening 42, and the first shielding cover 3802 is positioned closer to the pivot 50 than the second shielding cover 3804.

Each of the shielding covers 38 is respectively opened or closed so that the opening 42 is concealed or exposed and a variety of shielding effects is formed to shield and measure the wireless communication device 32. Thus, we can make sure whether signal strength of the wireless communication device 32 is good and procedure of software execution is correct.

As shown in FIG. 3, the first shielding cover 3802 and the second shielding cover 3804 are respectively opened or closed so that a variety of shielding effects are formed to meet requirement of measurement of the wireless communication device 32. The shielding covers 38 are detachable from and assembled with the shielding case 34, and the shielding covers 38 can be made of different materials. In addition, the shielding covers 38 have different thickness and different densities. Thus, a variety of shielding effects are formed by the shielding covers 38.

As described above, the materials of the shielding covers 38 can be insulation materials such as rubber, conductive material such as lead, stainless steel and aluminum, and carbon fiber composites. In addition to different materials, thickness and density of the shielding covers 38 and holes on the shielding covers 38 may be used to contribute to the shielding effects (dB value is shielded).

It is presumed that the shielding effect of the second shielding cover 3804 is 100 percentage of signal strength and the first shielding cover 3802 is 30 percentage of signal strength. As shown in FIG. 3, the shielding covers 38 are opened so there is no shielding effect. As shown in FIG. 4, the first shielding cover 3802 is closed so as to shield 30 percentage of signal strength. As shown in FIG. 5, both the first shielding cover 3802 and the second shielding cover 3804 are closed so as to shield 100 percentage of signal strength. In this light, the signal shielding box 30 of the present invention has three kinds of shielding configurations to form a variety of shielding effects. Usually, combination of these three kinds of configurations is used to meet requirement of shielding effect for the wireless communication device 32 such as mobile phone. Especially, these three kinds of configurations are switched to simulate a practical communication environment in which mobile phone signals are sometimes stronger and sometimes weaker.

Figure 6:
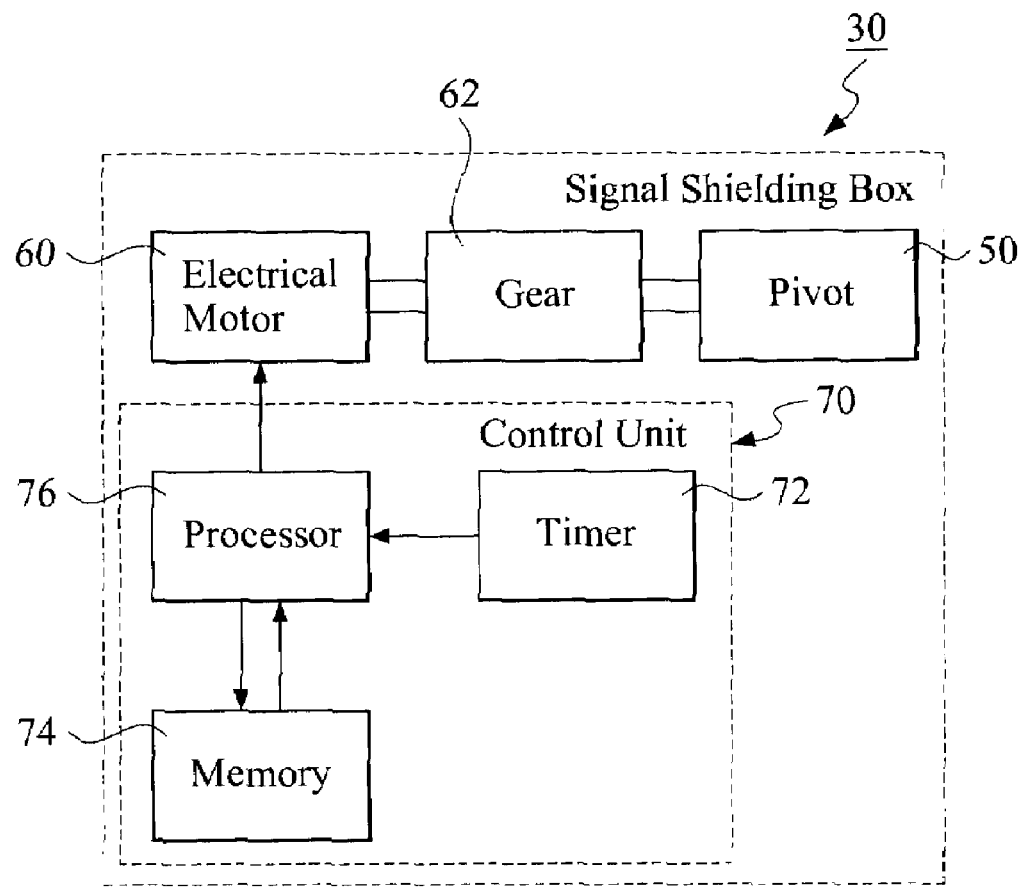
FIG. 6 is a block diagram of a signal shielding box according to the present invention.

Referring to FIGS. 2 and 6, FIG. 6 illustrates a block diagram of a signal shielding box 30 according to the present invention. Because the shielding covers 38 are pivotally connected with the pivot 50, the shielding covers 38 are easily opened and closed. The present invention also includes an electrical motor 60, and because the electrical motor 60 connects a gear 62 of the pivot 50 to drive the shielding covers 38 so that the opening 42 is concealed or exposed by the shielding covers 38.

The signal shielding box 30 of the present invention also includes a control unit 70 to automatically control the shielding covers 38 so that a variety of shielding effects are formed. The control unit 70 includes a timer 72, a memory 74, and a processor 76.

According to the present invention, the timer 72 is used to generate a clock signal, and the memory 74 can be a read-on memory (ROM), or a flash memory used to store a time period information.

The processor 76 can be a micro processor unit (MPC) or a central processor unit (CPU), and based on the clock signal generated from the timer 72 and the time period information stored in the memory 74, the processor 76 drives the electrical motor 60 to open or close the shielding covers 38 within the time period information. Thus, a variety of shielding effects are automatically formed in an alternate way.

Furthermore, the memory 74 also stores a count information, and the processor 76 drives the electrical motor 60 to open or close the shielding covers 38 at a pre-determined times based on the count information stored at the memory 74. In this light, the present invention is used to open and close the shielding covers 38 within the time period and at the pre-determined times. Then, with the measurement and analysis instrument 44, measurement and analysis are automatically conducted in an accurate and efficient way.

Therefore, according to the present invention, the signal shielding box 30 having the shielding covers 38 is used to form a plurality of shielding effects for measurement of the wireless communication device 32 and to simulate a practical communication environment. In addition, the signal shielding box 30 of the present invention does not need additional space when a plurality of shielding covers 38 are opened and closed so the present invention saves space. Because the shielding covers 38 are pivotally connected with the pivot 50, it is easy to open or close the shielding covers 38 and compatible with automatic design. Thus, it is easy to open and close the plurality of shielding covers 38, and measurement result is much more accurate.

While the invention has been described with reference to the preferred embodiments, the description is not intended to be construed in a limiting sense. It is therefore contemplated that the appended claims will cover any such modifications or embodiments as may fall within the scope of the invention defined by the following claims and their equivalents.

What is claimed is:

1. A signal shielding box having a plurality of shielding covers to measure and shield signals of a wireless communication device, comprising:
    a shielding case, used to receive the wireless communication device and having an opening;
    a connector, positioned at the shielding case and electrically connected with the wireless communication device within the shielding case, and electrically connected with a device out of the shielding case; and
    a plurality of shielding covers, pivotally and concentrically connected with the shielding case and covering one another to conceal respectively and expose the opening, wherein each of the shielding covers has a similar convex appearance, and the shielding covers are adjacent and move in a similar way and are respectively opened or closed to conceal or expose the opening so that a variety of shielding effects are formed to shield and measure signals of the wireless communication device.

2. The signal shielding box as claimed in claim 1, wherein the shielding covers comprise:
    a first shielding cover, pivotally connected with the shielding case to conceal or expose the opening; and
    a second shielding cover, pivotally connected with the shielding case to conceal or expose the opening, and the first shielding cover positioned closer to the pivot than the second shielding cover.

3. The signal shielding box as claimed in claim 1, wherein the signal shielding box is in spherical shape.

4. The signal shielding box as claimed in claim 1, wherein as viewed from side view of the signal shielding box, an angle of the sector between shielding covers ranges form 30 degrees to 180 degrees if the pivot is where the shielding covers are pivotally connected with the shielding case.

5. The signal shielding box as claimed in claim 1, wherein holes on the shielding covers and different materials, thickness and density of the shielding covers are used to contribute the variable shielding effects.

6. The signal shielding box as claimed in claim 1, wherein the shielding covers are detachable from and assembled with the shielding case.

7. The signal shielding box as claimed in claim 1, wherein the signal shielding box further includes an electrical motor which kinetically connects with the pivot of the pivot of the shielding case to drive the shielding covers to be opened and closed so that the opening is exposed and concealed.

8. The signal shielding box as claimed in claim 7, wherein the signal shielding box further includes a control unit to automatically control the shielding covers so that a variety of shielding effects are formed, and the control unit further comprises:
    a timer, used to generate a clock signal;
    a memory, used to store a time period information; and
    a processor, driving the electrical motor to open or close the shielding covers within the time period information based on the clock signal generated from the timer and the time period information stored in the memory.

9. The signal shielding box as claimed in claim 8, wherein the processor drives the electrical motor to open or close the shielding covers at a pre-determined times based on the count information stored at the memory.

10. The signal shielding box as claimed in claim 1, wherein the material of the shielding covers is rubber, lead, stainless steel, aluminum or carbon fiber composites.

11. A signal shielding box having a plurality of shielding covers to measure and shield signals of a wireless communication device, comprising:
    a shielding case, used to receive the wireless communication device and having an opening;
    a connector, positioned at the shielding case and electrically connected with the wireless communication device within the shielding case, and electrically connected with a device out of the shielding case;
    a plurality of shielding covers, pivotally and concentrically connected with the shielding case and covering one another to conceal respectively and expose the opening; and
    an electrical motor, kinetically connected with the pivot of the pivot of the shielding case, wherein the electrical motor drives the shielding covers to be respectively opened or closed to expose and conceal the opening, so that a variety of shielding effects are formed to shield and measure signals of the wireless communication device.

12. The signal shielding box as claimed in claim 11, wherein the shielding covers comprise:
    a first shielding cover, pivotally connected with the shielding case to conceal or expose the opening; and
    a second shielding cover, pivotally connected with the shielding case to conceal or expose the opening, and the first shielding cover positioned closer to the pivot than the second shielding cover.

13. The signal shielding box as claimed in claim 11, wherein each of the shielding covers has a similar convex appearance, and the shielding covers are adjacent and move in a similar way to conceal or expose the opening.

14. The signal shielding box as claimed in claim 11, wherein the signal shielding box is in spherical shape.

15. The signal shielding box as claimed in claim 13, wherein as viewed from side view of the signal shielding box, an angle of the sector between shielding covers ranges form 30 degrees to 180 degrees if the pivot is where the shielding covers are pivotally connected with the shielding case.

16. The signal shielding box as claimed in claim 11, wherein holes on the shielding covers and different materials, thickness and density of the shielding covers are used to contribute the variable shielding effects.

17. The signal shielding box as claimed in claim 11, wherein the signal shielding box further includes a control unit to automatically control the shielding covers so that a variety of shielding effects are formed, and the control unit further comprises:
 a timer, used to generate a clock signal;
 a memory, used to store a time period information; and
 a processor, driving the electrical motor to open or close the shielding covers within the time period information based on the clock signal generated from the timer and the time period information stored in the memory.

18. The signal shielding box as claimed in claim 17, wherein the processor drives the electrical motor to open or close the shielding covers at a pre-determined times based on the count information stored at the memory.

19. The signal shielding box as claimed in claim 11, wherein the material of the shielding covers is rubber, lead, stainless steel, aluminum or carbon fiber composites.

* * * * *